United States Patent
Sumbul et al.

(10) Patent No.: US 10,825,509 B2
(45) Date of Patent: Nov. 3, 2020

(54) FULL-RAIL DIGITAL READ COMPUTE-IN-MEMORY CIRCUIT

(71) Applicants: Huseyin Ekin Sumbul, Portland, OR (US); Gregory K. Chen, Portland, OR (US); Raghavan Kumar, Hillsboro, OR (US); Phil Knag, Hillsboro, OR (US); Abhishek Sharma, Hillsboro, OR (US); Sasikanth Manipatruni, Portland, OR (US); Amrita Mathuriya, Portland, OR (US); Ram Krishnamurthy, Portland, OR (US); Ian A. Young, Portland, OR (US)

(72) Inventors: Huseyin Ekin Sumbul, Portland, OR (US); Gregory K. Chen, Portland, OR (US); Raghavan Kumar, Hillsboro, OR (US); Phil Knag, Hillsboro, OR (US); Abhishek Sharma, Hillsboro, OR (US); Sasikanth Manipatruni, Portland, OR (US); Amrita Mathuriya, Portland, OR (US); Ram Krishnamurthy, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 33 days.

(21) Appl. No.: 16/146,932

(22) Filed: Sep. 28, 2018

(65) Prior Publication Data

US 2019/0103156 A1    Apr. 4, 2019

(51) Int. Cl.
    *G11C 11/00*     (2006.01)
    *G11C 11/419*     (2006.01)
    (Continued)

(52) U.S. Cl.
    CPC .......... *G11C 11/419* (2013.01); *G11C 7/1006* (2013.01); *G11C 7/12* (2013.01);
    (Continued)

(58) Field of Classification Search
    CPC .... G11C 11/412; G11C 11/418; G11C 11/419
    (Continued)

(56) References Cited

U.S. PATENT DOCUMENTS 9,336,861 B1 * 5/2016 Moharir ................ G11C 11/412
10,120,674 B2 * 11/2018 Brederlow ................ G06F 8/65
(Continued)

OTHER PUBLICATIONS

Ambrogio, S., et al., "Equivalent-Accuracy Accelerated Neural-Network Training Using Analogue Memory," Nature, vol. 558, Jun. 7, 2018, 22 pages.

(Continued)

*Primary Examiner* — Hoai V Ho
*Assistant Examiner* — Minh Dinh
(74) *Attorney, Agent, or Firm* — Compass IP Law PC

(57) ABSTRACT

A full-rail digital-read CIM circuit enables a weighted read operation on a single row of a memory array. A weighted read operation captures a value of a weight stored in the single memory array row without having to rely on weighted row-access. Rather, using full-rail access and a weighted sampling capacitance network, the CIM circuit enables the weighted read operation even under process variation, noise and mismatch.

17 Claims, 9 Drawing Sheets

(51) Int. Cl.
G11C 27/02 (2006.01)
G11C 7/10 (2006.01)
G11C 7/12 (2006.01)
G11C 11/412 (2006.01)
G11C 11/418 (2006.01)

(52) U.S. Cl.
CPC .......... *G11C 27/024* (2013.01); *G11C 11/412* (2013.01); *G11C 11/418* (2013.01)

(58) Field of Classification Search
USPC .......................................................... 365/156
See application file for complete search history.

(56) References Cited

U.S. PATENT DOCUMENTS

| | | | |
|---|---|---|---|
| 2004/0190334 A1* | 9/2004 | Baker ...................... | G11C 7/06 365/158 |
| 2016/0232951 A1* | 8/2016 | Shanbhag ................ | G11C 7/12 |

OTHER PUBLICATIONS

Biswas, A., et al., "A 42pJ/decision 3.12TOPS/W Robust In-Memory Machine Learning Classifier With On-Chip Training," 2018 IEEE International Solid—State Circuits Conference—(ISSCC), San Francisco, CA, 2018, pp. 488-490.
Fick, D., et al., "Analog Computation in Flash Memory for Datacenter-Scale AI Inference in a Small Chip", 2.05 Mythic Hot Chips, 2018, 28 pages.
Gonugondla, S.K., et al., "A 42pJ/decision 3.12TOPS/W Robust In-Memory Machine Learning Classifier With On-Chip Training," 2018 IEEE International Solid—State Circuits Conference—(ISSCC), San Francisco, CA, 2018, pp. 490-492.
Henzler, S., "Chapter 2, Time-to-Digital Converter Basics", Springer Series in Advanced Microelectronics 29, 2, Springer Science+Business Media B.V. 2010.
Kang, M., et al., "An In-Memory VLSI Architecture for Convolutional Neural Networks", http://ieee-cas.org/pubs/jetcas, Published Version DOI: 10.1109/JETCAS.2018.2829522, Publication Apr. 23, 2018, IEEE Circuits and Systems Society, 13 pages.
Mason, A., "Memory Basics", Michigan State, ECE 410, Chapter 13 Lecture Notes, pp. 13.1-13.34, 2010.
Solanki, Umang, "How does SRAM work?", https://www.quora.com/How-does-SRAM-work, Aug. 17, 2017, 2 pages.
Stone, Harold S. "A Logic-In-Memory Computer", IEEE Transactions on Computers, Jan. 1970, 6, pages.
Zhang, J., et al., "In-Memory Computation of a Machine-Learning Classifier in a Standard 6T SRAM Array," in IEEE Journal of Solid-State Circuits, vol. 52, No. 4, 10 pages, Apr. 2017.

* cited by examiner

FULL-RAIL DIGITAL READ COMPUTE-IN-MEMORY CIRCUIT

FIELD

The descriptions are generally related to memory, and more particularly to compute-in-memory circuits for memory cell arrays.

BACKGROUND

Compute-in-memory (CIM) circuits can perform certain computing operations on large amounts of data more quickly than a conventional digital processing system, in part because of the memory bottleneck between memory and processing units, referred to as the von Neumann bottleneck. For this reason, CIM circuits can be used to support data intensive applications such as machine learning and artificial intelligence.

CIM circuits perform basic vector and/or matrix operations within a memory array directly, eliminating the need to transfer data to a compute engine. CIM circuits based on analog operations allow for lower cost computation and higher effective memory bandwidth, but are susceptible to process variation, noise and mismatch in the context of providing a deterministic output.

BRIEF DESCRIPTION OF THE DRAWINGS

The described embodiments are illustrated by way of example and not limitation in the figures of the accompanying drawings, in which like references indicate similar elements and in which.

Figure 1:
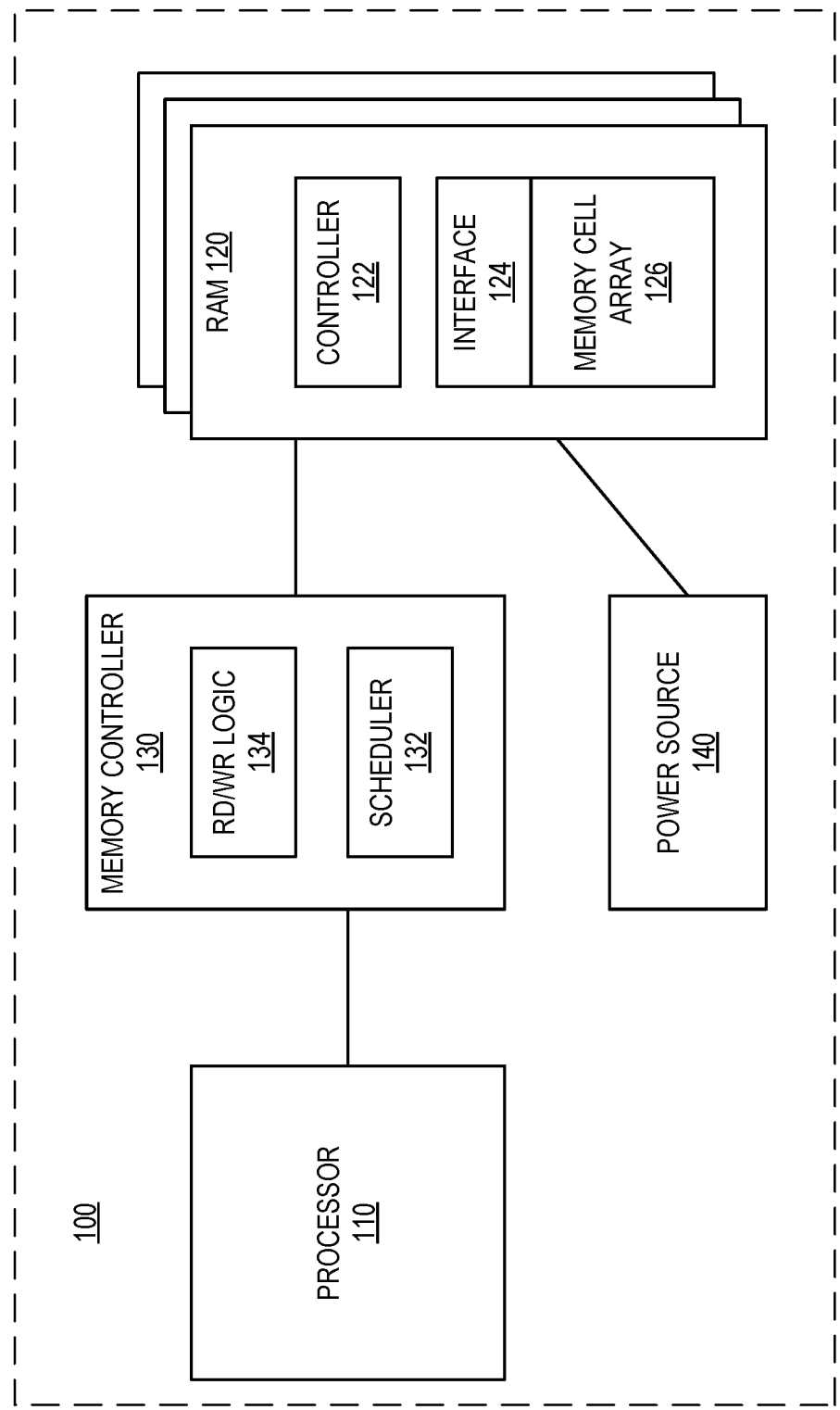
FIG. 1 is a schematic block diagram of a memory device that includes a memory cell array configured as a full-rail digital-read compute-in-memory circuit in accordance with various examples described herein.

Other features of the described embodiments will be apparent from the accompanying drawings and from the detailed description that follows.

DETAILED DESCRIPTION

In a CIM circuit a weight matrix is stored within the memory cells of a memory array. Wordline access of the memory array is modulated through time with pulse-width modulation, or through voltage with amplitude modulation, to accurately read multi-bit weights per column using analog voltages within a read cycle. An input is multiplied with the analog voltages of a weight vector in the analog domain and the results are accumulated at the end of the read cycle. As such, the dot-product of the matrix-vector is achieved for an input vector (e.g., the input activations in machine learning (ML)) after multiple read cycles. The output of the matrix-vector dot product is determined from the read voltages of the bitlines of the memory array.

In a typical analog operation, in order to enable the weight to be read from the bitlines, the weight matrix is stored in a column major format in the memory array of the CIM circuit as opposed to a row major format as would occur in conventional memory read from an SRAM (static random access memory) memory device. To read the weight on the bitline, multiple wordline drivers are activated at the same time. In order to ensure that most significant bits (MSB) are given greater weight during the analog read operation, the wordlines of the CIM circuit are accessed in a bit-position weighted manner by pulsing wordline drivers for the MSB of the stored weight for a longer duration (i.e. pulse-width modulation) or by varying the voltage levels used to access the wordlines (i.e. amplitude modulation).

Prior to a read operation, the bitlines in the memory array are precharged to the memory supply voltage $V_{DD}$. When multiple wordline drivers are activated, the bitlines discharge to a voltage proportional to the values stored in the corresponding columns of the memory array. Since the wordline accesses are bit-position weighted, the resulting bitline voltage drop ($\Delta V_{BL}$) is directly proportional to the binary stored word in the corresponding column. For example, for a 4-bit weight the total bitline voltage discharge is proportional to $[d_0+2*d_1+4*d_2+8*d_3]$, where $d_0$, $d_1$, $d_2$ and $d_3$ are the values of the weight stored in each memory cell of the corresponding column. The $\Delta V_{BL}$ can be captured on a sampling capacitance or a sense amplifier.

Although the above-described analog-CIM circuits provide high throughput for machine learning applications, the analog nature of both weighted row-access through modulating wordline voltage or pulse-width access time, and the need to read multi-bit weights on a single BL within limited voltage head-room make the analog operations susceptible to process variation, noise, and mismatch in the context of providing a deterministic output.

To address these challenges, a full-rail digital-read CIM circuit configured in accordance with the various examples as herein described enables a weighted read operation to capture a value of the weight stored in a single memory array row without having to rely on weighted row-access or risk exceeding limited voltage head-room. Rather, using full-rail access on BLs driven by a single memory array row and a weighted sampling capacitance network, the CIM circuit enables a weighted read operation even under process variation, noise and mismatch.

In one embodiment of a full-rail digital read CIM circuit, weights of a weight matrix are stored in row major order instead of column major order as is typically done for analog CIM operations. Each bit position of the weight is mapped to corresponding columns of the memory array. To access the weights, a memory access circuit initiates a read operation on a single memory array row. The weighted read operation captures the weight stored in the single memory array row at each bit position in terms of read voltage values on the corresponding bitlines. A sampling capacitance network connected to the bitlines weights the read operation according to the mapped bit positions.

Examples of an apparatus, system and method are described herein for a full-rail digital-read CIM circuit enabling a weighted read operation on a single memory array row.

FIG. 1 is a schematic block diagram of a memory device that includes a memory cell array that can be used in a full-rail digital-read CIM circuit in accordance with various examples described herein. System 100 includes components of a memory subsystem having random access memory (RAM) 120 to store and provide data in response to operations of processor 110. System 100 receives memory access requests from a host or a processor 110, which is processing logic that executes operations based on data stored in RAM 120 or generates data to store in RAM 120. Processor 110 can be or include a host processor, central processing unit (CPU), microcontroller or microprocessor, graphics processor, peripheral processor, application specific processor, or another processor, and can be single core or multicore.

System 100 includes memory controller 130, which represents logic to interface with RAM 120 and manage access to data stored in the memory. In one embodiment, memory controller 130 is integrated into the hardware of processor 110. In one embodiment, memory controller 130 is standalone hardware, separate from processor 110. Memory controller 130 can be a separate circuit on a substrate that includes the processor. Memory controller 130 can be a separate die or chip integrated on a common substrate with a processor die (e.g., as a system on a chip (SoC)). In one embodiment, memory controller 130 is an integrated memory controller (iMC) integrated as a circuit on the processor die. In one embodiment, at least some of RAM 120 can be included on an SoC with memory controller 130 and/or processor 110.

In one embodiment, memory controller 130 includes read/write logic 134, which includes hardware to interface with RAM 120. Logic 134 enables memory controller 130 to generate read and write commands to service requests for data access generated by the execution of instructions by processor 110. In one embodiment, memory controller 130 includes scheduler 132 to schedule the sending of access commands to RAM 120 based on known timing parameters for read and write access for RAM 120. Known timing parameters can be those that are preprogrammed or otherwise preconfigured into system 100. Such parameters can be stored in RAM 120 and accessed by memory controller 130. In one embodiment, at least some parameters are determined by synchronization procedures. The timing parameters can include the timing associated with write latency for RAM 120. The write latency for RAM 120 can depend on the type of memory technology. In one embodiment, RAM 120 can be a static RAM (SRAM) memory cell capable of supporting compute-in-memory operations on memory cell array 126.

In one embodiment, RAM 120 includes interface 124 (e.g., interface logic) to control the access to memory cell array 126. Interface 124 can include decode logic, including logic to address specific rows or columns or bits of data. In one embodiment, interface 124 includes logic to control the amount of current provided to specific memory cells of memory device array 126. Thus, control over writing to memory cell array 126 can occur through driver and/or other access logic of interface 124. Controller 122 represents an on-die controller on RAM 120 to control its internal operations to execute commands received from memory controller 130. For example, controller 122 can control any of timing, addressing, I/O (input/output) margining, scheduling, and error correction for RAM 120.

In one embodiment, controller 122 is configured to read and write memory cell array 126 in accordance with any embodiment described herein. In one embodiment, controller 122 can differentiate between different logic-states as a consequence of the programming polarity of a memory cell. For example, in one embodiment, controller 122 can read a memory cell by applying a voltage drop via interface 124 to the memory cell to determine the state (e.g., a higher stable state or lower stable state) of the memory cell.

In one embodiment, when controller 122 is to write to a memory cell, controller 122 applies a quick pulse to the memory cell to program the polarity of the memory cell. In one such embodiment, programming in forward polarity will put the cell in one state (e.g., a lower threshold state) and programming in reverse polarity will put the cell in the other state (e.g., a higher threshold state). For example, in one embodiment, controller 122 applies a pulse in one polarity (e.g., bitline positive and wordline negative) to write a value (e.g., a '1') or in the other polarity (e.g., bitline negative and wordline positive) to write another value (e.g., a '0'). In one such embodiment, controller 122 applies a pulse that is sufficient to trigger the cell in its higher or lower stable state. System 100 includes power source 140, which can be a voltage source or regulator that provides power to RAM 120. Controller 122 and interface 124 can use the power available from power source 140 to apply a voltage drop to access a memory cell of array 126.

Figure 2:
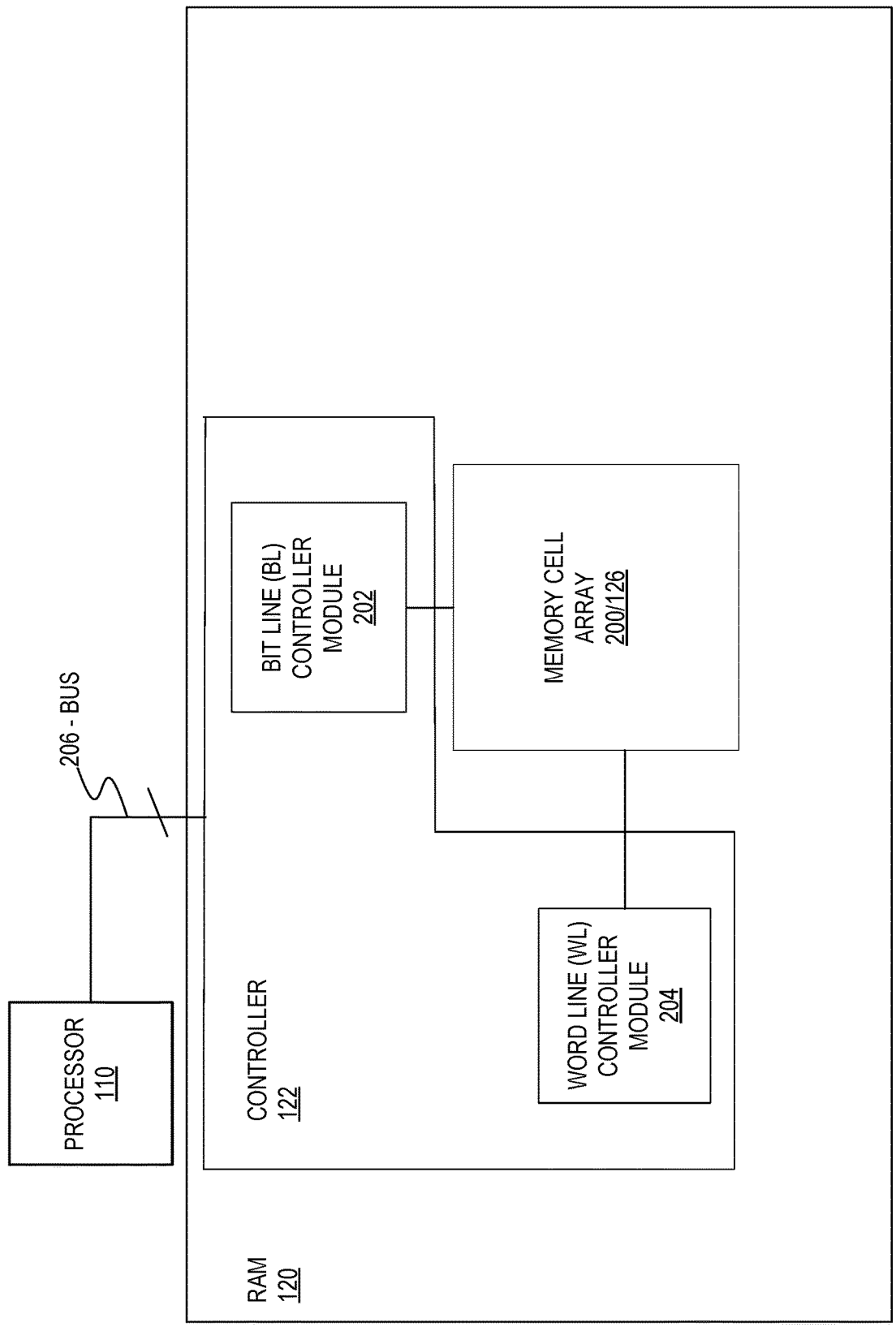
FIG. 2 is a schematic block diagram of further details of a memory device that includes a memory cell array configured as a full-rail digital-read compute-in-memory circuit in accordance with various examples described herein.

FIG. 2 is a schematic block diagram of further details of a memory device that includes a binary compute-in-memory (CIM) circuit in accordance with various examples described herein. The processor 110 communicates via bus 206 with RAM 120 via controller 122. Memory cell array 200 includes a plurality of memory cells that are accessible via a plurality of word lines ("WL"), a plurality of bit lines ("BL") 206. Memory cell array 200 is configured to store data and may be written to (i.e., programmed) or read from. Each memory cell includes a memory element configured to store information such as a weight of a weight matrix used in a machine learning algorithm to support compute-in-memory operations on the memory cell array 200.

Memory controller 122 includes WL control module 204 and BL control module 202. Memory controller 122 is configured to initiate and manage accessing the memory cell array 200 to carry out compute-in-memory operations. Memory controller 122 is further configured to manage operations of WL control module 204 and BL control module 202 to carry out the compute-in-memory operations as described herein.

Figure 3:
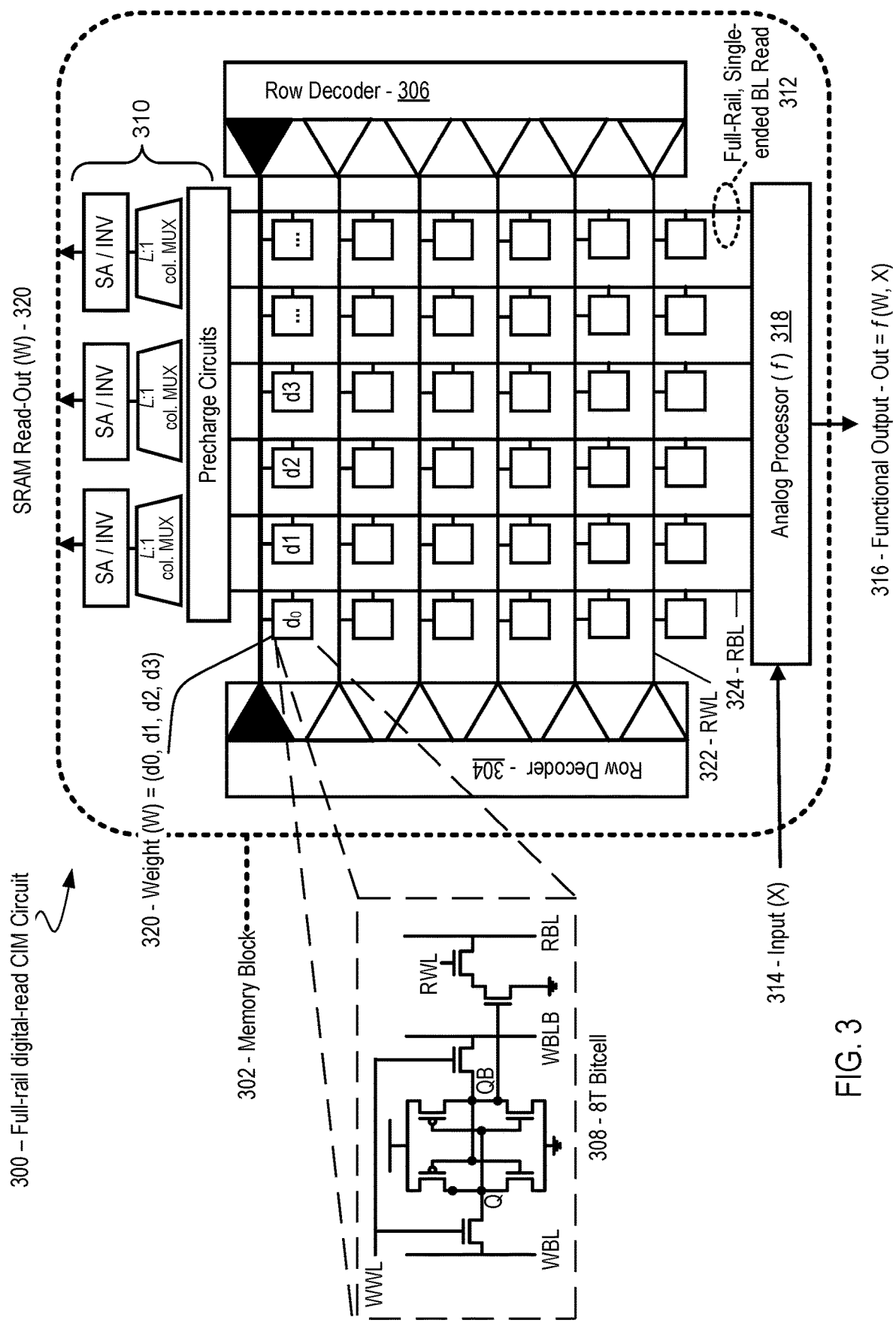
FIG. 3 illustrates a schematic view of a full-rail digital-read compute-in-memory circuit in accordance with various examples described herein.

FIG. 3 illustrates one embodiment of a full-rail digital-read CIM circuit 300 using an 8T SRAM cell 308. By way of example only, and not limitation, the memory cells comprise an array of memory cells for storing 4-bit weights, such as might be used in a machine learning application. Although the full-rail digital-read CIM circuit 300 is shown as using 8T SRAM cells 308, other types of memory cells could be used, such as an 6T SRAM cell or 10T SRAM cell, as long as the cell is capable of storing weights and driving the bitline voltages as described in the examples that follow. Additional periphery circuits and memory access techniques may be required for correct operation on differential read type memory cells to drive the bitlines in a range of $V_{high}$ (such as $V_{DD}$) to $V_{low}$. For example, certain periphery circuits and memory access techniques may be required for 6T SRAM cell types due to challenges such as read-upset, etc.

As shown in FIG. 3, the CIM circuit is capable of performing conventional SRAM operations such as SRAM read and SRAM write through conventional memory periphery 310. In the descriptions of CIM invention that follows, it is assumed that CIM circuit includes the conventional memory periphery 310 to perform traditional read and write operations correctly, and therefore 310 is not explicitly shown for easier depiction.

In one embodiment, and by way of example only, the full-rail digital-read CIM circuit 300 includes a memory block 302 comprising an array of memory cells 308 for storing a weight W 320 composed of values $d_0, d_1, d_2, d_3$ in row-major order, a memory access circuitry including row decoders 304/306 for accessing read wordlines (RWL) 322, precharge circuits 310 and an analog processor (f) 318 for capturing a full-rail single-ended bitline read voltage 312 on each read bitline (RBL) 324 of the memory array 302. Other weight W word dimensions can be stored in the memory array. During operation of the CIM circuit 300 an input X 314 representing an input vector for operation on the weight W 320 is provided to the analog processor 318, resulting in a functional output=f(W, X) 316.

In a full-rail digital read CIM circuit 300, the weight W 320 is stored in row-major format and the read operation is initiated through single row access. For example, rows within the memory array of memory block 302 are accessed one by one through the row-decoders 304/306 using non-weighted digital access. During operation, the precharge circuit 310 precharges the bitlines to a memory supply voltage $V_{DD}$. Depending on the value of the stored bit of weight W 320 at each position within the row, e.g., the respective values of $d_0, d_1, d_2, d_3$, the precharged bitlines are either left floating at $V_{DD}$ or are fully discharged to 0V when the row is accessed. As will be described in further detail, CIM circuit 300 performs the full-rail digital-read operation through sampling the final read bitline RBL voltages 312 at 0V or $V_{DD}$. In one embodiment, both row access and bitline driving are single-ended full-rail digital operations and do not require any modifications to either row-decoders 304/306 or the 8T bitcells 308 comprising the memory cell array in memory block 302.

Figure 4:
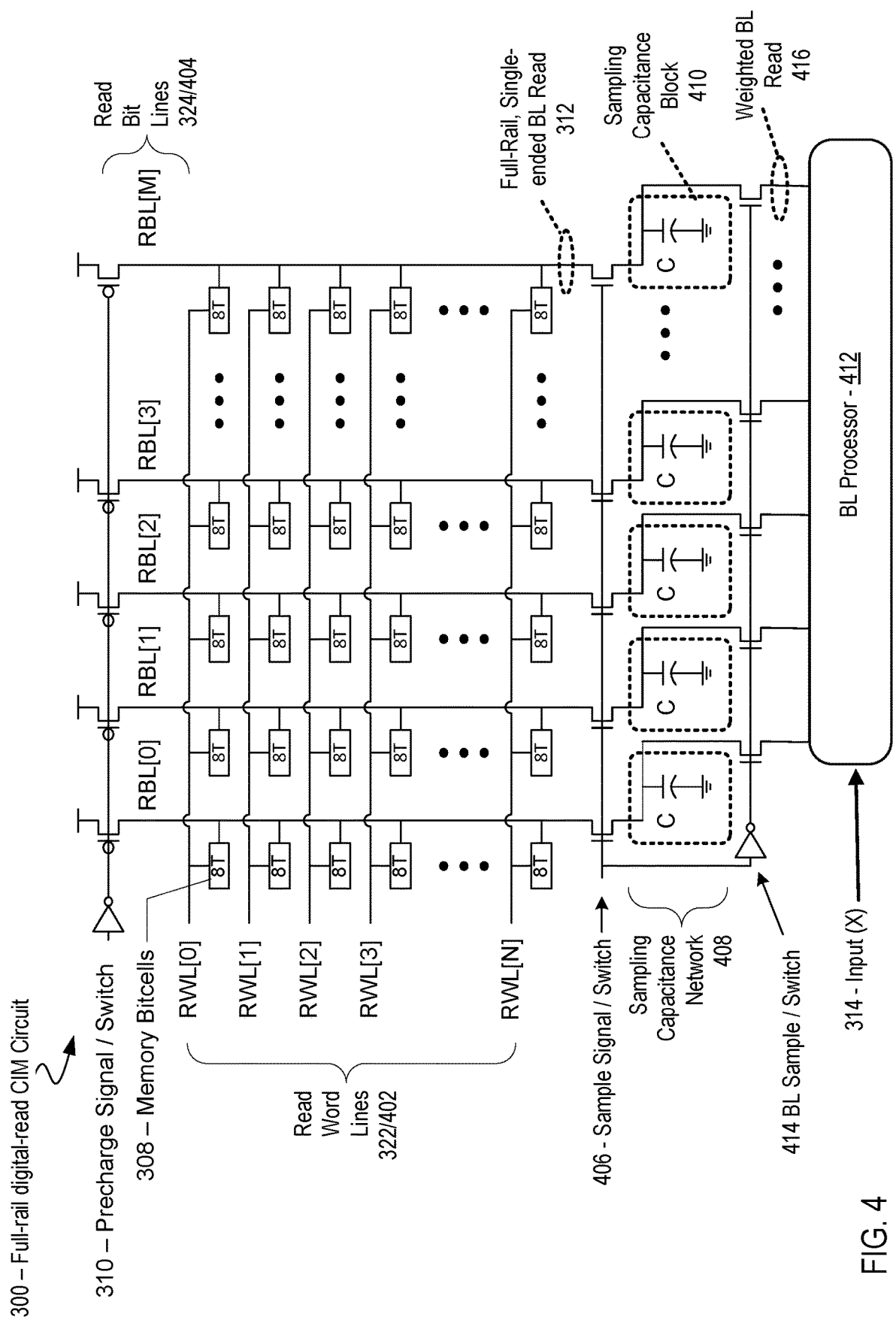
FIGS. 4-7 illustrate schematic views of a full-rail digital-read compute-in-memory circuit in accordance with various examples described herein.

FIG. 4 illustrates a schematic view of the memory access circuit and sampling capacitance network used in a full-rail digital-read CIM circuit 300. In the illustrated embodiment, conventional bitline sensing circuits (such as sense-amplifiers, skewed inverters, etc.) and column-muxing circuits are replaced by a sampling capacitance network 408 that includes sampling capacitance blocks 410 pitch-matched and connected to each read bitline (RBL) 324, e.g. RBL[0], RBL[1], RBL[2], RBL[3] . . . RBL[M], for accessing the memory array of memory cells 308 in memory block 302. In this manner each column in a given row can be accessed without any column-muxing, thereby maximizing the row read-out throughput.

In one embodiment, the sampling capacitance per column, $C_{Sample/COL}$ of each sampling capacitance block 410 is connected to each RBL 324 through a sampling switch 406. The switch can be an N-type field effect transistor (NFET), a positive FET (pFET) or other type of transmission-gate, depending on the hardware specifications. In one embodiment, the switch connection is controlled by a "sample" signal 406. In the same way, the sampling capacitance per column $C_{Sample/COL}$ of sample capacitance block 410 is optionally connected to a second BL switch 414 in parallel, which in turn connects in serial to the analog BL processor 412.

In one embodiment, the sample signal 406 controls a sampling event with respect to the full-rail digital read operation carried out by the CIM circuit 300. In one embodiment, a conventional "precharge" signal controls pre-charging the read bitlines (RBLs) 324, such as might be performed by the precharge circuit 310 (FIG. 3). Before initiating the read operation, the precharge of the RBLs 324 and the sample signal 406 are enabled concurrently so that each RBL 324 and $C_{Sample/COL}$ of sampling capacitance block 410 are precharged to $V_{DD}$. To commence the read operation the precharge signal on the RBLs 324 is disabled and one of the RWLs 402, e.g. RWL[0], RWL[1], RWL[2], RWL[3], . . . RWL[N], accesses a corresponding single row of the memory array in memory block 302. The activated memory cells on the accessed row (e.g. RWL[0]) drive the pre-charged RBLs 324 individually to 0V or leave them floating at the precharged voltage $V_{DD}$, depending on the value of the stored bit (e.g., $d_0, d_1, d_2, d_3$) in the activated memory cell 308.

In one embodiment, the sample signal 406 is enabled at the same time that the memory cells 308 start driving the RBLs 324, such that a given sample capacitance 'C' is added to the total RBL capacitance in parallel. Each memory cell 308 drives the RBL+$C_{Sample/COL}$ per column. At the end of the read operation, each $C_{Sample/COL}$ in sampling capacitance block 410 holds either 0V or $V_{DD}$, essentially capturing the stored bit (e.g. do) of the activated memory cell 308 in terms of a voltage value.

In one embodiment, the CIM circuit 300 concludes the read operation, disabling the sampling signal 406 and activating a capacitance BL sampling switch 414 to pass the weighted sampled values, i.e. weighted BL read voltages 416 to a BL processor 412 through charge-sharing for further processing. In one embodiment, BL processor 412 uses the weighted BL read voltages 416 and input X 314 to perform a dot-product operation or other analog-based arithmetic operations.

In one embodiment, the sampling capacitance block C 410 can be implemented via the gate-capacitance of a minimum sized transistor, so that the effects of the added capacitance on the RBLs 324 is negligible. This ensures the CIM circuit 300 read operation has the same approximate latency for a same-sized memory array in memory block 302. In some embodiments, the sampling capacitance block C 410 may be implemented using a metal-oxide-semiconductor, metal-insulator-metal, metal-oxide-metal or other types of capacitance structures.

Figure 5:
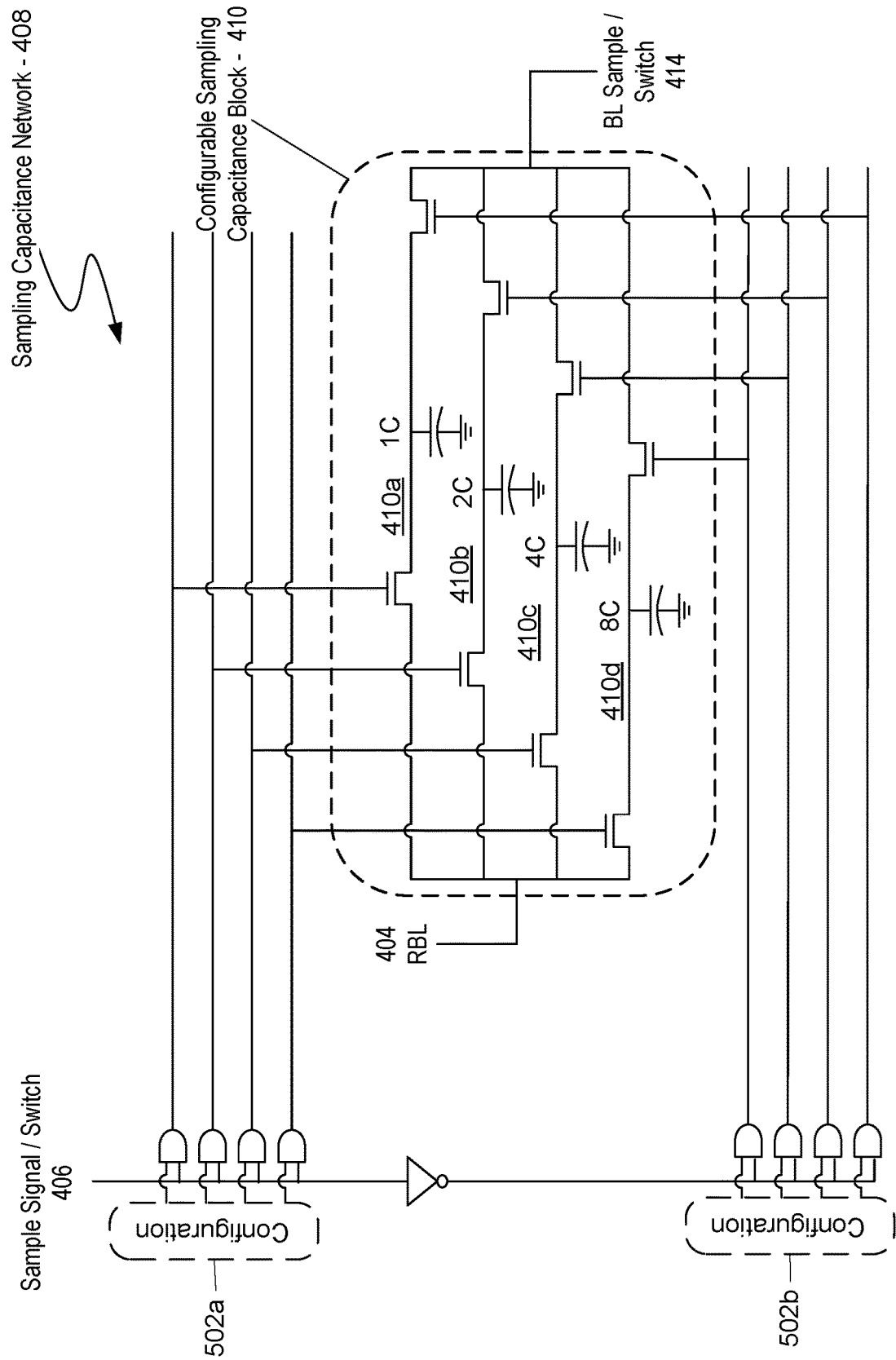

FIG. 5 illustrates in further detail a schematic view of the sampling capacitance network 408 used in a full-rail digital-read CIM circuit 300. In the illustrated embodiment, to enable a multi-bit full-rail digital read operation, a sampling capacitance block 410 is implemented as a configurable capacitance array as shown in FIG. 5. Configurations 500a/500b generate shared one-hot control signals (e.g. 0001, 0001, 0100, 1000) run across the columns to activate or deactivate individually sized sampling capacitances 410a, 410b, 410c, 410d within each C block per column/RBL 324. For example, in one embodiment, to carry out a full-rail digital read of a 4-bit weight stored in the memory array, e.g., $d_0, d_1, d_2, d_3$, the sampling capacitance network 408 is configured to use four distinct C values of [1×C, 2×C, 4×C, and 8×C] 410a, 410b, 410c, 410d that provide a power of 2 weighting.

Figure 6:
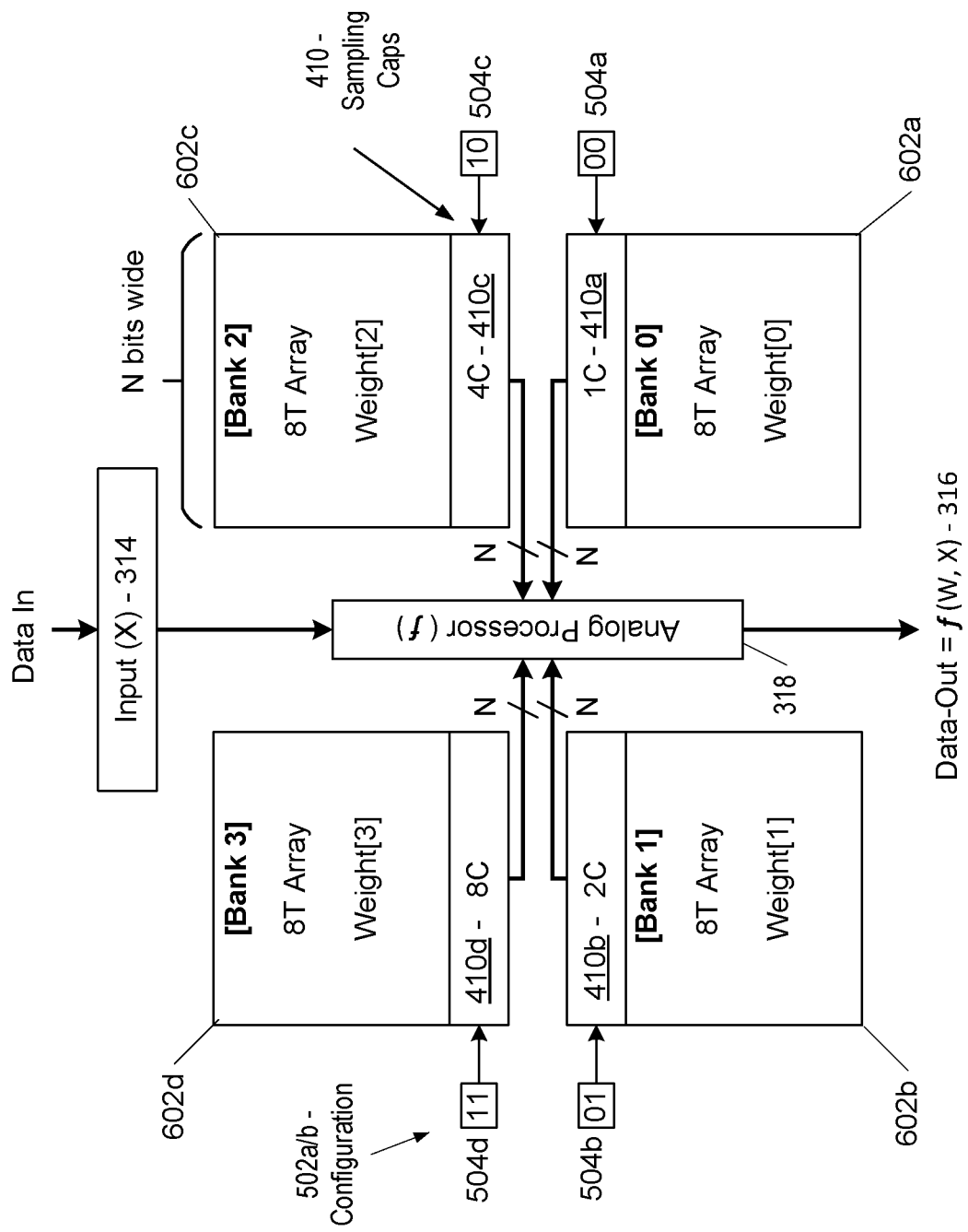

FIG. 6 illustrates in further detail a schematic view of using a sampling capacitance network 408 as described in FIG. 5 in a full-rail digital-read CIM circuit 300 in which the memory arrays are partitioned into banks to further enable a multi-bit full-rail digital read operation. In the illustrated example of FIG. 6, the memory arrays 302 are partitioned into 4 sub-arrays, each array referred to as a bank of memory, Bank[0] 602a, Bank[1] 602b, Bank[2] 602c, Bank [3] 602d. When partitioned into banks, the bit positions in a 4-bit weight are mapped to separate banks instead of columns.

For example, with reference to the partitioned banks in FIG. 6, and using the example weight W=[$d_0$, $d_1$, $d_2$, $d_3$] introduced in FIG. 3, the bit $d_0$ is mapped to [Bank 0], $d_1$ is mapped to [Bank 1], $d_2$ is mapped to [Bank 2] and $d_3$ is mapped to [Bank 3] for every weight W stored in the CIM circuit 300. As in the non-partitioned memory array of memory block 302, the sampling capacitance values C are configured via shared one-hot control signals 502a/502b/502c/502d with respect to the corresponding bit-position, e.g. 1C for [Bank 0] 410a, 2C for [Bank 1] 410b, 4C for [Bank 2] 410c, and 4C for [Bank 3] 410d. Configuring the capacitance value C to the corresponding bit position of the weight mapped to the memory sub-array ensures that the read operation is performed as a weighted read operation, such that bit position <K> of the stored multi-bit weight W, e.g., $d_0$, $d_1$, $d_2$, $d_3$, is sampled on a capacitance value of $C \times 2^K$.

In one embodiment, for a CIM circuit 300 using memory sub-arrays 602a/602b/602c/602d of N-bits per row, each sub-array <K> concurrently samples a given bit position <K> of N weights as N-bit values and passes them to an analog processor 318 for further analog operation. As a result, using an example of 4-bit weights, a full-rail digital-read operation of the CIM circuit 300 enables reading a total of (4×N)-bits of N-weights in one cycle, with each bit correctly sampled on a weighted capacitance value C 410a/410b/410c/410d based on the mapped bit position. In one embodiment, partitioning a memory array of a memory block 302 into sub-arrays 602a/602b/602c/602d enables the full-rail digital-read CIM circuit 300 to provide the same throughput as compared to CIM circuits that use conventional analog CIM operation (e.g. analog CIM circuits in which the weight is stored in column major order and read using weighted row-access).

In one embodiment, only the sampling capacitance network 408 is pitch-matched to the columns/RBLs 324 while the analog processor 318 is built with a more relaxed layout. In some embodiments, the sampling capacitance C block 410 and the analog processor 318 may be implemented in a pitch-matched fashion. In one embodiment, the configurable sampling capacitance array values for C in sampling capacitance C block 410 can be configured to different discrete values per column instead of per sub-array. In such an embodiment, all bits of a given weight W are stored within the same sub-array row to eliminate the need for partitioning. In one embodiment, configurable sampling capacitance block 410 can be replaced with hardwired (i.e. dedicated) sampling capacitance values for minimizing hardware area, such that each sub-array is connected to a single pre-set capacitance value rather than a reconfigurable capacitance node 500a/500b as illustrated in FIG. 5.

Figure 7:
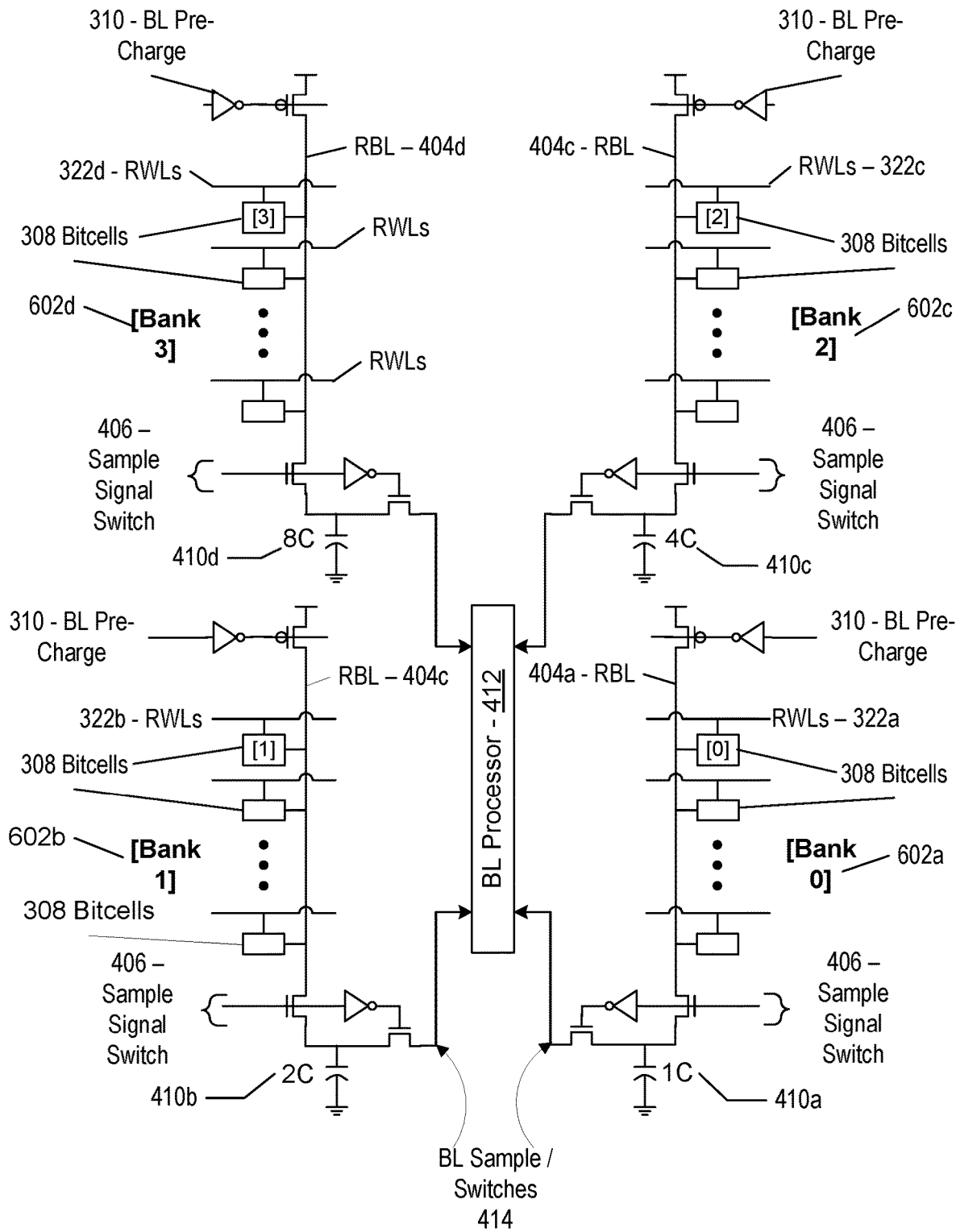

FIG. 7 illustrates a schematic view of a single full-rail digital-read operation carried out by a CIM circuit 300 in accordance with one embodiment. As illustrated, each bit of an example 4-bit weight is stored in a respective memory sub-array partitioned into a separate memory bank, e.g. [Bank 0] 602a, [Bank 1] 602b, [Bank 2] 602c, [Bank 3] 602d. A precharge signal generated by precharge circuit 310 precharges each column, i.e. each RBL 324a/324b/324c/324d in the corresponding sub-arrays 602a/602b/602c/602d to memory supply voltage $V_{DD}$. Next, the respective RWLs 322a/322b/322c/322d in each bank accesses each memory cell 308 containing the stored bit on the respective rows of the sub-arrays 602a/602b/602c/602d. The accessed memory cells 308 drive the respective RBLs 324a/324b/324c/324d and the respective configured sampling capacitances C 410a/410b/410c/410d while the sample signal 406 is high. Next, once the bits are sampled, the CIM circuit 300 disables the sample signal 406 to each bank of sub-arrays 602a/602b/602c/602d and the sampled 414 weighted BL read values 416 are passed to the analog BL processor 412. The same operations are repeated at the next row, which constitutes the next weighted read cycle of the full-rail digital-read CIM circuit 300.

In one embodiment, a full-rail digital-read CIM circuit 300 as described herein trades off memory area to scalability when compared to analog CIM circuits since the 8T-bitcell array used in the full-rail digital-read CIM circuit 300 occupies a larger area as compared to the 6T-bitcell arrays used in analog CIM circuits. However, the full-rail digital-read CIM circuit 300 advantageously eliminates any need for customized and pitch-matched circuitry (such as digital to analog converters (DACs), analog to digital converters (ADCs), sense amplifiers and column-muxes), and thereby decreases the overall area overhead of the periphery circuit.

Moreover, for establishing same throughput for an example of 4-bit weights, 4×N bitlines can be driven and pre-charged to full-rail per read cycle in a full-rail digital-read CIM circuit 300 while only N bitlines RBL 324 are driven and pre-charged within the operating voltage range of $V_{DD}$-$V_{min}$ in analog CIM circuits, creating a possible energy overhead. In one embodiment, the possible energy overhead associated with the full-rail digital CIM circuit may be minimized by lowering the precharge voltage level of the read bitlines RBLs 324. Since the operation of the full-rail digital-read CIM circuit 300 is always full-rail, lowering the read bitline voltages (e.g. $V_{BL}$) would not affect the correct functionality of the weighted read operation 416 carried out by the full-rail digital-read CIM circuit 300. In some embodiments, the analog BL processor 412 can be replaced with a digital processing block. In such embodiments, the sampling capacitances may be eliminated and the read bitlines RBL 324 can instead be directly connected to the digital BL processor's logic gates.

Although the full-rail digital-read CIM circuit 300 has been described as a full-rail operation, in some embodiments it may be desirable to implement the weighted read operation with read bitlines that are coupled to the memory cells using both the bitline and bitline bar. Such a configuration would enable differential signal sensing but would not operate with full-rail output swing. While not an optimal configuration, the use of the bitline and bitline bar will allow for denser storage of weights in the memory array of memory block 302 and allow more memory cells 308 to occupy the same footprint in the CIM circuit 300, albeit requiring double capacitance blocks instead of one capacitor block per read bitline RBL 324. Such differential bitline read type memory cells may further require pitch-matched single or double sense amplifiers per column, as well as additional periphery circuitry to eliminate memory read-upsets.

Figure 8A:
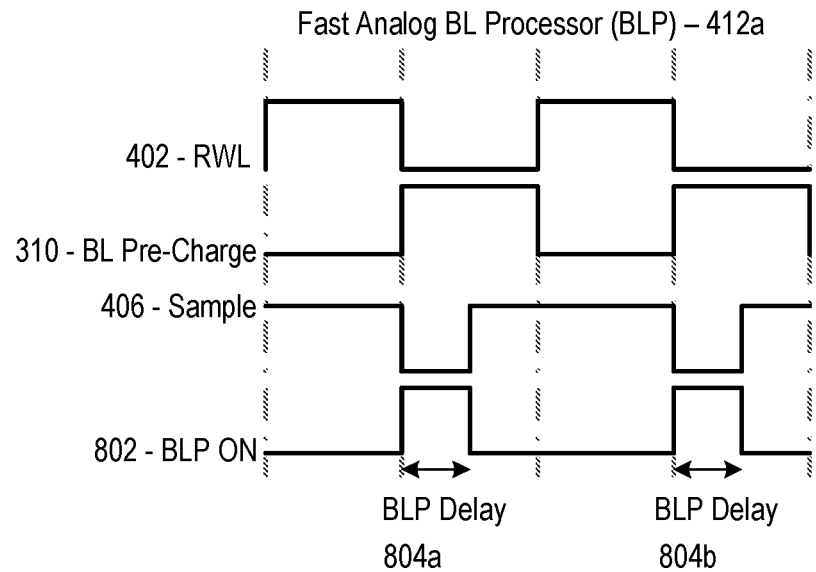
FIGS. 8A-8B illustrate various timing diagrams describing the operation of a full-rail digital-read compute-in-memory circuit in accordance with various examples described herein.
Figure 8B:
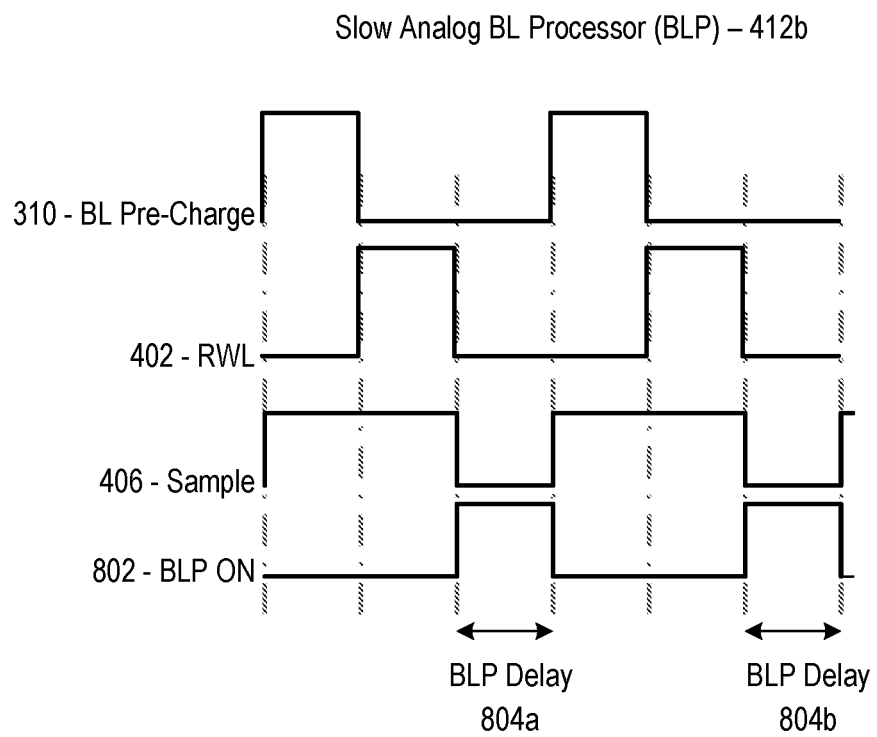

FIGS. 8A-8B illustrate various signal timing diagrams describing the weighted read operation of a full-rail digital-read compute-in-memory circuit 300 in accordance with various examples described herein. In one embodiment, the analog BL processor 412 performs operations more quickly than the precharge operation 310 in the sub-arrays 602a/602b/602c/602d. To optimize operational efficiency of the full-rail digital-read CIM circuit 300, an analog BL processor operation, BLP ON 802, can be hidden under the latency of the bitline (BL) pre-charge operation 310 without affecting the read wordline RWL row access signals 322 and the sampling event signals 406 as depicted in the timing model of FIG. 8A. Using this approach, the full-rail digital-read cycle is similar to a conventional 8T-based memory access cycle in terms of timing with respect to a clock.

In an alternate embodiment in which the analog BL processor operation takes a considerable amount of time which cannot be hidden under pre-charge operation, the full-rail digital-read cycle may be structured in three phases as illustrated in FIG. 8B: 1) bitline (BL) pre-charge 310, 2) read wordline (RWL) row access 322 and memory cells 308 driving read bitline (RBL)+sample capacitance C, and 3) analog BL processing, BLP ON 802. The timing relationships illustrated in FIGS. 8A-8B are by way of example only and not limitation. Other timing relationships between sampling event, pre-charge and other control signals are also possible to implement a full-rail digital-read CIM circuit 300 in accordance with an embodiment, depending on the latency of the analog BL processor 412.

Figure 9:
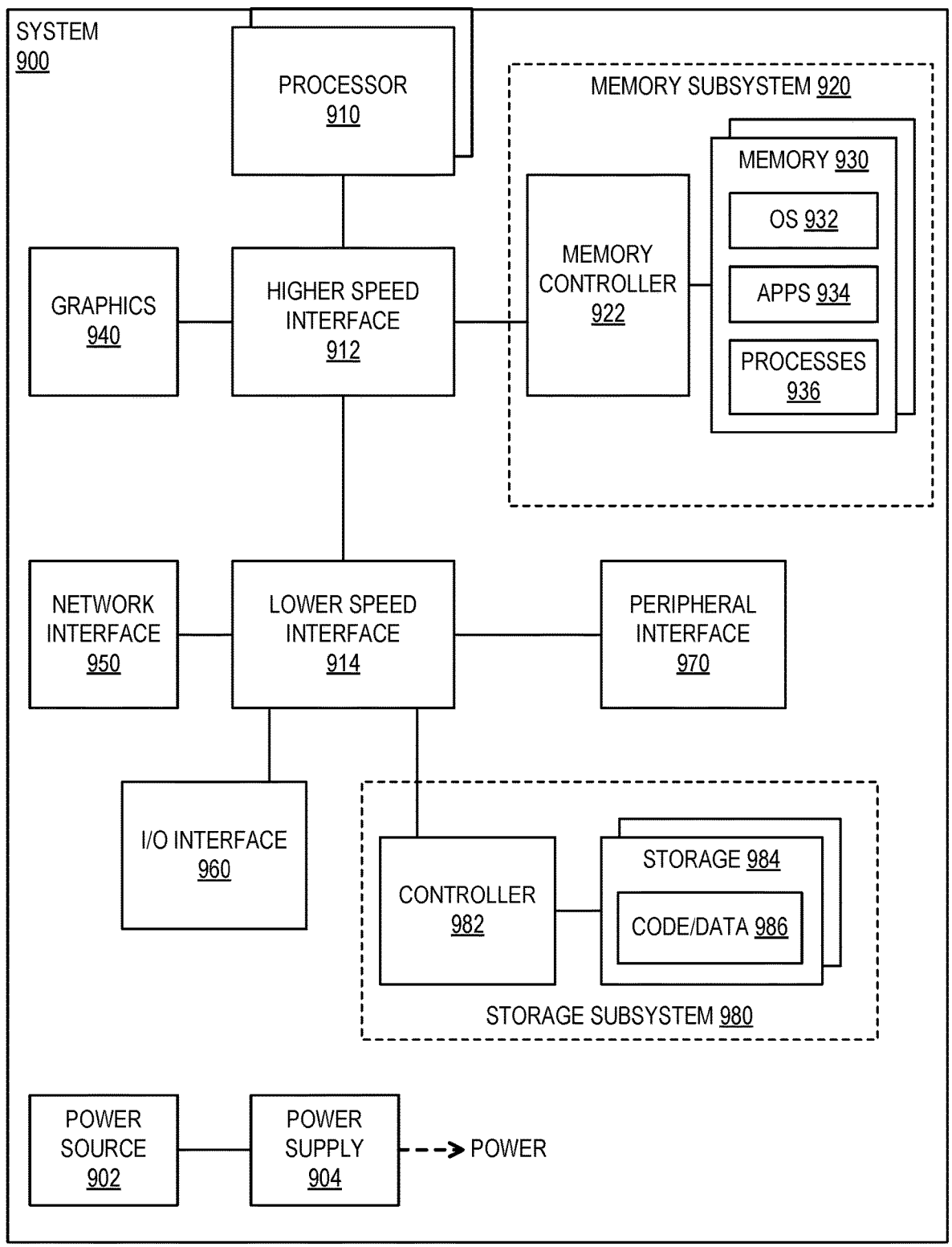
FIG. 9 is a schematic block diagram of a computing system in which a full-rail digital-read compute-in-memory circuit can be implemented in accordance with various examples described herein.

FIG. 9 is a block diagram of a computing system in which a memory device having a full-rail digital-read CIM circuit can be included, in accordance with an embodiment.

System 900 represents a computing device in accordance with any embodiment described herein, and can be a laptop computer, a desktop computer, a server, a gaming or entertainment control system, a scanner, copier, printer, routing or switching device, embedded computing device, or other electronic device.

System 900 includes processor 910, which provides processing, operation management, and execution of instructions for system 900. Processor 910 can include any type of microprocessor, central processing unit (CPU), graphics processing unit (GPU), processing core, or other processing hardware to provide processing for system 900, or a combination of processors. Processor 910 controls the overall operation of system 900, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one embodiment, system 900 includes interface 912 coupled to processor 910, which can represent a higher speed interface or a high throughput interface for system components that needs higher bandwidth connections, such as memory subsystem 920 or graphics interface components 940. Interface 912 can represent a "north bridge" circuit, which can be a standalone component or integrated onto a processor die. Graphics interface 940 interfaces to graphics components for providing a visual display to a user of system 900. In one embodiment, graphics interface 940 generates a display based on data stored in memory 930 or based on operations executed by processor 910 or both.

Memory subsystem 920 represents the main memory of system 900 and provides storage for code to be executed by processor 910, or data values to be used in executing a routine. Memory subsystem 920 can include one or more memory devices 930 such as read-only memory (ROM), flash memory, one or more varieties of random access memory (RAM), or other memory devices, or a combination of such devices. Memory devices 930 can include memory devices having memory cell arrays incorporating higher and lower resistivity materials as described herein.

Memory 930 stores and hosts, among other things, operating system (OS) 932 to provide a software platform for execution of instructions in system 900. Additionally, applications 934 can execute on the software platform of OS 932 from memory 930. Applications 934 represent programs that have their own operational logic to perform execution of one or more functions. Processes 936 represent agents or routines that provide auxiliary functions to OS 932 or one or more applications 934 or a combination. OS 932, applications 934, and processes 936 provide logic to provide functions for system 900. In one embodiment, memory subsystem 920 includes memory controller 922, which is a memory controller to generate and issue commands to memory 930. It will be understood that memory controller 922 could be a physical part of processor 910 or a physical part of interface 912. For example, memory controller 922 can be an integrated memory controller, integrated onto a circuit with processor 910.

While not specifically illustrated, it will be understood that system 900 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire").

In one embodiment, system 900 includes interface 914, which can be coupled to interface 912. Interface 914 can be a lower speed interface than interface 912. In one embodiment, interface 914 can be a "south bridge" circuit, which can include standalone components and integrated circuitry. In one embodiment, multiple user interface components or peripheral components, or both, couple to interface 914. Network interface 950 provides system 900 the ability to communicate with remote devices (e.g., servers or other computing devices) over one or more networks. Network interface 950 can include an Ethernet adapter, wireless interconnection components, USB (universal serial bus), or other wired or wireless standards-based or proprietary interfaces. Network interface 950 can exchange data with a remote device, which can include sending data stored in memory or receiving data to be stored in memory.

In one embodiment, system 900 includes one or more input/output (I/O) interface(s) 960. I/O interface 960 can include one or more interface components through which a user interacts with system 900 (e.g., audio, alphanumeric, tactile/touch, or other interfacing). Peripheral interface 970 can include any hardware interface not specifically mentioned above. Peripherals refer generally to devices that connect dependently to system 900. A dependent connection is one where system 900 provides the software platform or hardware platform or both on which operation executes, and with which a user interacts.

In one embodiment, system 900 includes storage subsystem 980 to store data in a nonvolatile manner. In one embodiment, in certain system implementations, at least certain components of storage 980 can overlap with components of memory subsystem 920. Storage subsystem 980 includes storage device(s) 984, which can be or include any conventional medium for storing large amounts of data in a nonvolatile manner, such as one or more magnetic, solid state, or optical based disks, or a combination. Storage 984 holds code or instructions and data 986 in a persistent state (i.e., the value is retained despite interruption of power to system 900). Storage 984 can be generically considered to be a "memory," although memory 930 is typically the executing or operating memory to provide instructions to processor 910. Whereas storage 984 is nonvolatile, memory 930 can include volatile memory (i.e., the value or state of the data is indeterminate if power is interrupted to system 900). In one embodiment, storage subsystem 980 includes controller 982 to interface with storage 984. In one embodiment controller 982 is a physical part of interface 914 or processor 910, or can include circuits or logic in both processor 910 and interface 914.

Power source 902 provides power to the components of system 900. More specifically, power source 902 typically interfaces to one or multiple power supplies 904 in system 900 to provide power to the components of system 900. In one embodiment, power supply 904 includes an AC to DC (alternating current to direct current) adapter to plug into a wall outlet. Such AC power can be renewable energy (e.g., solar power) power source 902. In one embodiment, power source 902 includes a DC power source, such as an external AC to DC converter. In one embodiment, power source 902 or power supply 904 includes wireless charging hardware to charge via proximity to a charging field. In one embodiment, power source 902 can include an internal battery or fuel cell source.

Any methods, processes and logic depicted in the foregoing figures can comprise hardware (e.g. circuitry, dedicated logic, controllers, etc.), software (such as is run on a general-purpose computer system or a dedicated machine, e.g. a software module or logic), and interfaces (such as a memory interface) between hardware and software, or a combination of both. Although the processes and logic may have been described in terms of some sequential operations, it should be appreciated that some of the operations described can be performed in a different order. Moreover, some operations can be performed in parallel rather than sequentially.

While numerous specific details have been set forth to provide a thorough explanation of embodiments of the methods, media, apparatus, processes and systems for a full-rail digital-read CIM circuit, it will be apparent to one skilled in the art that an embodiment can be practiced without one or more of these specific details. In other instances, well-known components, structures, and techniques have not been shown in detail so as to not obscure the understanding of this description.

Reference in the foregoing specification to "one embodiment" or "an embodiment" means that a particular feature, structure, or characteristic described in connection with the embodiment can be included in at least one embodiment. The appearances of the phrase "in one embodiment" in various places in the specification do not necessarily all refer to the same embodiment.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Additional Example Implementations are as Follows:

Example 1 is any of a method, system, apparatus or computer-readable medium for an integrated circuit that includes a memory array of memory cells to store weights in row major order, a weight having multiple bit positions, each bit position mapped to a corresponding column of the memory array, a stored bit of the weight stored in a memory cell in the corresponding column, a memory access circuit to initiate a read operation on a single memory array row, and a sampling capacitance network connected to the memory access circuit, the sampling capacitance network to weight the read operation according to the mapped bit positions, the weighted read operation to capture a value of the weight stored in the single memory array row.

Example 2 is any of the method, system, apparatus or computer-readable medium of Example 1 in which the memory access circuit includes a read wordline (RWL) coupled to the memory array row, a plurality of read bitlines (RBLs), an RBL coupled to one of the corresponding columns, and the read operation initiated on the single memory array row includes the plurality of RBLs precharged with a memory supply voltage, and the RWL to activate the memory cells in the corresponding columns to drive precharged RBLs to their respective final read voltages, including any one of a 0V or the memory supply voltage, the final read voltages representing values at each mapped bit position of the weight stored in the single memory array row.

Example 3 is any of the method, system, apparatus or computer-readable medium of Examples 1 or 2, where, depending on a value of the stored bit, an activated memory cell is to drive a precharged RBL to the final read voltage of 0V or leave the precharged RBL at the memory supply voltage.

Example 4 is any of the method, system, apparatus or computer-readable medium of Examples 1, 2 or 3, where the stored bit value is any of a value of "1" and "0."

Example 5 is any of the method, system, apparatus or computer-readable medium of Examples 1, 2, 3 or 4 where the integrated circuit includes a BL switch to precharge each RBL of the plurality of RBLs to the memory supply voltage and a WL driver timed to cause the RWL to activate the memory cells after the BL switch precharges the plurality of RBLs.

Example 6 is any of the method, system, apparatus or computer-readable medium of Examples 1, 2, 3, 4 or 5 where the sampling capacitance network includes one or more sampling capacitance blocks to connect a capacitor to an RBL using any of a metal-oxide-semiconductor, metal-insulator-metal and metal-oxide-metal capacitance structures, and a gate capacitance of a transistor.

Example 7 is any of the method, system, apparatus or computer-readable medium of Examples 1, 2, 3, 4, 5 or 6 where the one or more sampling capacitance blocks is a configurable capacitance array having sampling capacitance array values configured according to the mapped bit positions of the corresponding columns of the memory cell array.

Example 8 is any of the method, system, apparatus or computer-readable medium of Examples 1, 2, 3, 4, 5, 6 or 7 where the sampling capacitance network includes a sampling event switch to connect the sampling capacitance network to the plurality of RBLs, precharge the sampling capacitance network with the memory supply voltage, weight the read operation with a capacitance value C added to each RBL in parallel, wherein the capacitance value C is configured according to the mapped bit position of the corresponding column to which the RBL is coupled, and wherein weighted final read voltages are read from the sampling capacitance network connected to the plurality of RBLs.

Example 9 is any of the method, system, apparatus or computer-readable medium of Examples 1, 2, 3, 4, 5, 6, 7 or 8 where the sampling event switch is timed to precharge the sampling capacitance network before the activated memory cells commence to drive the precharged RBLs to their respective final read voltages.

Example 10 is any of the method, system, apparatus or computer-readable medium of Examples 1, 2, 3, 4, 5, 6, 7, 8 or 9 where the memory array is partitioned into separate banks of memory subarrays, wherein each bit position of a weight is mapped to a corresponding one of the separate banks of memory subarrays instead of a corresponding column of the memory array, the separate banks of memory subarrays to enable the sampling capacitance network to weight the read operation with the capacitance value C configured according to the mapped bit position of the corresponding bank of memory subarrays.

Example 11 is any of the method, system, apparatus or computer-readable medium of Examples 1, 2, 3, 4, 5, 6, 7, 8, 9 or 10 further including an analog processor to perform unit machine learning operations on the stored weight captured during the read operation, the unit machine learning operations based on charge sharing, wherein the analog processor is to receive the captured weight passed from the sampling capacitance network upon completion of the weighted read operation.

Example 12 is any of the method, system, apparatus or computer-readable medium of Examples 1, 2, 3, 4, 5, 6, 7, 8, 9, 10 or 11 where the memory array comprises a static random access memory (SRAM) memory array.

Example 13 is any of the method, system, apparatus or computer-readable medium of Examples 1, 2, 3, 4, 5, 6, 7, 8, 9, 10, 11 or 12 where the memory cells of the memory array comprise a type of bitcell having any one of a single-ended read bitline to enable single-ended full-rail read operation, including an 8T bitcell, and differential bitlines to enable greater memory array density while requiring differential signal sensing and additional memory periphery circuits, including a 6T bitcell.

Example 14 is any of a method, system, apparatus or computer-readable medium for an integrated circuit that includes a compute-in-memory (CIM) circuit, the CIM circuit comprising a computation circuit coupled to a memory array, the computation circuit comprising a memory access circuit to initiate a read operation on a single memory array row of the memory array, and a sampling capacitance network connected to the memory access circuit, the sampling capacitance network to weight the read operation according to a mapped bit position of a weight stored in the single memory array row.

Example 15 is any of the method, system, apparatus or computer-readable medium of Example 14 in which the weight stored in the single memory array row is a multi-bit weight, a mapped bit position of a bit of the multi-bit weight mapped to memory array columns spanning the memory array row.

Example 16 is any of the method, system, apparatus or computer-readable medium of Examples 14 or 15 where the memory access circuit includes a read wordline (RWL) coupled to the memory array row, read bitlines (RBLs) coupled to memory cells in the memory array columns spanning the memory array row, and the read operation initiated on the single memory array row includes the RBLs precharged with a memory supply voltage, and the RWL to activate the memory cells to drive precharged RBLs to their respective final read voltages, including any one of a 0V or the memory supply voltage.

Example 17 is any of the method, system, apparatus or computer-readable medium of Examples 14, 15 or 16 where the sampling capacitance network includes one or more sampling capacitance blocks to connect a capacitor of capacitance value C to each RBL, a sampling event switch to cause a sampling signal to precharge the sampling capacitance network with the memory supply voltage, add the capacitance value C to each RBL in parallel, and final read voltages on RBLs, each weighted based on the capacitance value C, the weighted final read voltages representing the weight stored in the single memory array row.

Example 18 is any of the method, system, apparatus or computer-readable medium of Examples 14, 15, 16 or 17 where the capacitance value C configured according to the mapped bit position corresponding to the RBL based on a memory array column of memory cells to which the RBL is coupled.

Example 19 is any of the method, system, apparatus or computer-readable medium of Examples 14, 15, 16, 17 or 18 where the one or more sampling capacitor blocks comprise any of a metal-oxide-semiconductor, metal-insulator-metal and metal-oxide-metal capacitance structures, and a gate capacitance of a transistor.

Example 20 is any of the method, system, apparatus or computer-readable medium of Examples 14, 15, 16, 17, 18 or 19 where the memory array is partitioned into separate banks of memory subarrays, wherein each bit position of a weight is mapped to a corresponding one of the separate banks of memory subarrays instead of a the memory array column spanning the memory array row, the separate banks of memory subarrays to enable the sampling capacitance network to weight the read operation with the capacitance value C configured according to the mapped bit position of the corresponding bank of memory subarrays.

Example 21 is any of the method, system, apparatus or computer-readable medium of Examples 14, 15, 16, 17, 18, 19 or 20 where the memory array comprises a static random access memory (SRAM) memory array.

Example 22 is any of a method, system, apparatus or computer-readable medium for an integrated circuit that includes a processor, a memory device communicatively coupled with the processor, the memory device including a compute-in-memory (CIM) circuit, the CIM circuit comprising a computation circuit coupled to a memory array, the computation circuit comprising a memory access circuit to initiate a read operation on a single memory array row of the memory array, and a sampling capacitance network connected to the memory access circuit, the sampling capacitance network to weight the read operation according to mapped bit positions of a weight stored in the single memory array row, the mapped bit positions corresponding to memory array columns spanning the single memory array row.

Example 23 is any of a method, system, apparatus or computer-readable medium of Example 22, where the memory access circuit includes a read wordline (RWL) coupled to the memory array row and read bitlines (RBLs) coupled to memory cells in the memory array columns spanning the memory array row, the capacitance network includes one or more sampling capacitance blocks to connect a capacitor of capacitance value C to each RBL, and the capacitance value C is configured according to the mapped bit positions of the weight stored in the single memory array row.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. An integrated circuit comprising:
a memory array of memory cells to store weights in row major order, a weight having multiple bit positions, each bit position mapped to a corresponding column of the memory array, a stored bit of the weight stored in a memory cell in the corresponding column;
a memory access circuit to initiate a read operation on a single memory array row,
the memory access circuit including:
a read wordline (RWL) coupled to the memory array row;
a plurality of read bitlines (RBLs), an RBL coupled to one of the corresponding columns;
the read operation initiated on the single memory array row including:
the plurality of RBLs precharged with a memory supply voltage, and
the RWL to activate the memory cells in the corresponding columns to drive precharged RBLs to their respective final read voltages, including any one of a 0V or the memory supply voltage, the final read voltages representing values at each mapped bit position of the weight stored in the single memory array row;
a sampling capacitance network connected to the memory access circuit, the sampling capacitance network to weight the read operation according to the mapped bit positions, the weighted read operation to capture a value of the weight stored in the single memory array row, the sampling capacitance network including a sampling event switch to:
connect the sampling capacitance network to each RBL;
precharge the sampling capacitance network with the memory supply voltage;
weight the read operation with a capacitance value C added to each RBL in parallel, wherein the capacitance value C is configured according to the mapped bit position of the corresponding column to which the RBL is coupled; and
wherein weighted final read voltages are read from the sampling capacitance network connected to each RBL.

2. The integrated circuit of claim 1 wherein, depending on a value of the stored bit, an activated memory cell is to any of:
drive a precharged RBL to the final read voltage of 0V; and
leave the precharged RBL at the memory supply voltage.

3. The integrated circuit of claim 2 wherein the stored bit value is any of a value of "1" and "0."

4. The integrated circuit of claim 2, the integrated circuit further comprising:
a BL switch to precharge each RBL of the plurality of RBLs to the memory supply voltage; and
a WL driver timed to cause the RWL to activate the memory cells after the BL switch precharges the plurality of RBLs.

5. The integrated circuit of claim 2, wherein the sampling capacitance network includes one or more sampling capacitance blocks to connect a capacitor to an RBL using any of a metal-oxide-semiconductor, metal-insulator-metal and metal-oxide-metal capacitance structures, and a gate capacitance of a transistor.

6. The integrated circuit of claim 5, wherein the one or more sampling capacitance blocks is a configurable capacitance array having sampling capacitance array values configured according to the mapped bit positions of the corresponding columns of the memory cell array.

7. The integrated circuit of claim 1, wherein the sampling event switch is timed to precharge the sampling capacitance network before the activated memory cells commence to drive the precharged RBLs to their respective final read voltages.

8. The integrated circuit of claim 1, wherein the memory array is partitioned into separate banks of memory subarrays, wherein each bit position of a weight is mapped to a corresponding one of the separate banks of memory subarrays instead of a corresponding column of the memory array, the separate banks of memory subarrays to enable the sampling capacitance network to weight the read operation with the capacitance value C configured according to the mapped bit position of the corresponding bank of memory subarrays.

9. The integrated circuit of claim 1, further comprising:
an analog processor to perform unit machine learning operations on the stored weight captured during the read operation, the unit machine learning operations based on charge sharing, wherein the analog processor is to receive the captured weight passed from the sampling capacitance network upon completion of the weighted read operation.

10. The integrated circuit of claim 1, wherein the memory array comprises a static random access memory (SRAM) memory array.

11. The integrated circuit of claim 10, wherein the memory cells of the memory array comprise a type of bitcell having any one of:
a single-ended read bitline to enable single-ended full-rail read operation, including an 8T bitcell; and
differential bitlines to enable greater memory array density while requiring differential signal sensing and additional memory periphery circuits, including a 6T bitcell.

12. An apparatus, comprising:
a compute-in-memory (CIM) circuit, the CIM circuit comprising a computation circuit coupled to a memory array, the computation circuit comprising:
a memory access circuit to initiate a read operation on a single memory array row of the memory array, the memory access circuit comprising a read wordline (RWL) coupled to the memory array row and read bitlines (RBLs) coupled to memory cells in the memory array columns spanning the memory array row, the read operation including:
the RBLs precharged with a memory supply voltage, and
the RWL to activate the memory cells to drive the precharged RBLs to their respective final read voltages, including any one of a 0V or the memory supply voltage;
a sampling capacitance network connected to the memory access circuit, the sampling capacitance network to weight the read operation according to a mapped bit position of a weight stored in the single memory array row, the weight including a multi-bit weight, a mapped bit position of a bit of the multi-bit weight mapped to memory array columns spanning the memory array row, the sampling capacitance network comprising:
one or more sampling capacitance blocks to connect a capacitor of capacitance value C to each RBL, and
a sampling event switch to cause a sampling signal to precharge the sampling capacitance network with the memory supply voltage and add the capacitance value C to each RBL in parallel; and
wherein final read voltages on the RBLs, each weighted based on the capacitance value C, represent the weight stored in the single memory array row.

13. The apparatus of claim 12, the capacitance value C configured according to the mapped bit position corresponding to the RBL based on a memory array column of memory cells to which the RBL is coupled.

14. The apparatus of claim 12, the one or more sampling capacitor blocks comprising any of a metal-oxide-semiconductor, metal-insulator-metal and metal-oxide-metal capacitance structures, and a gate capacitance of a transistor.

15. The apparatus of claim 12, wherein the memory array is partitioned into separate banks of memory subarrays, wherein each bit position of a weight is mapped to a corresponding one of the separate banks of memory subarrays instead of a the memory array column spanning the memory array row, the separate banks of memory subarrays to enable the sampling capacitance network to weight the read operation with the capacitance value C configured according to the mapped bit position of the corresponding bank of memory subarrays.

16. The apparatus of claim 12, wherein the memory array comprises a static random access memory (SRAM) memory array.

17. A system comprising:
a processor;
a memory device communicatively coupled with the processor, the memory device including a compute-in-memory (CIM) circuit, the CIM circuit comprising a computation circuit coupled to a memory array, the computation circuit comprising:
a memory access circuit to initiate a read operation on a single memory array row of the memory array, the memory access circuit comprising a read wordline (RWL) coupled to the memory array row and read bitlines (RBLs) coupled to memory cells in the memory array columns spanning the memory array row, the read operation including:
the RBLs precharged with a memory supply voltage, and
the RWL to activate the memory cells to drive the precharged RBLs to their respective final read voltages, including any one of a 0V or the memory supply voltage;
a sampling capacitance network connected to the memory access circuit, the sampling capacitance network to weight the read operation according to mapped bit positions of a weight stored in the single memory array row, the mapped bit positions corresponding to memory array columns spanning the single memory array row, the capacitance network comprising one or more sampling capacitance blocks to connect a capacitor of capacitance value C to each RBL and a sampling event switch to cause a sampling signal to precharge the sampling capacitance network with the memory supply voltage and add the capacitance value C to each RBL in parallel; and
wherein:
the capacitance value C is configured according to the mapped bit positions of the weight stored in the single memory array row, and
the final read voltages on the RBLs, each weighted based on the capacitance value C, represent the weight stored in the single memory array row.

* * * * *

UNITED STATES PATENT AND TRADEMARK OFFICE
CERTIFICATE OF CORRECTION

PATENT NO. : 10,825,509 B2
APPLICATION NO. : 16/146932
DATED : November 3, 2020
INVENTOR(S) : Huseyin Ekin Sumbul et al.

Page 1 of 3

It is certified that error appears in the above-identified patent and that said Letters Patent is hereby corrected as shown below:

In the Claims

Claim 7 should read:
7. The integrated circuit of claim 1, wherein the sampling event switch is timed to precharge the sampling capacitance network before activated memory cells commence to drive the precharged RBLs to their respective final read voltages.

Claim 8 should read:
8. The integrated circuit of claim 1, wherein the memory array is partitioned into separate banks of memory subarrays, wherein each bit position of a weight is mapped to a corresponding one of the separate banks of memory subarrays instead of a corresponding column of the memory array, the separate banks of memory subarrays to enable the sampling capacitance network to weight the read operation with the capacitance value C configured according to the mapped bit position of the corresponding one of the separate banks of memory subarrays.

Claim 9 should read:
9. The integrated circuit of claim 1, further comprising:
    an analog processor to perform unit machine learning operations on a stored weight captured during the read operation, the unit machine learning operations based on charge sharing, wherein the analog processor is to receive a captured weight passed from the sampling capacitance network upon completion of the weighted read operation.

Claim 12 should read:
12. An apparatus, comprising:
    a compute-in-memory (CIM) circuit, the CIM circuit comprising a computation circuit coupled to a memory array, the computation circuit comprising:
        a memory access circuit to initiate a read operation on a single memory array row of the memory array, the memory access circuit comprising a read wordline (RWL)

Signed and Sealed this
First Day of June, 2021

Drew Hirshfeld
*Performing the Functions and Duties of the
Under Secretary of Commerce for Intellectual Property and
Director of the United States Patent and Trademark Office* coupled to the memory array row and read bitlines (RBLs) coupled to memory cells in memory array columns spanning the memory array row, the read operation including:
    the RBLs precharged with a memory supply voltage, and
    the RWL to activate the memory cells to drive precharged RBLs to their respective final read voltages, including any one of a 0V or the memory supply voltage;
a sampling capacitance network connected to the memory access circuit, the sampling capacitance network to weight the read operation according to a mapped bit position of a weight stored in the single memory array row, the weight including a multi-bit weight, a mapped bit position of a bit of the multi-bit weight mapped to memory array columns spanning the memory array row, the sampling capacitance network comprising:
    one or more sampling capacitance blocks to connect a capacitor of capacitance value C to each RBL, and
    a sampling event switch to cause a sampling signal to precharge the sampling capacitance network with the memory supply voltage and add the capacitance value C to each RBL in parallel; and
wherein final read voltages on the RBLs, each weighted based on the capacitance value C, represent the weight stored in the single memory array row.

Claim 14 should read:
14. The apparatus of Claim 12, the one or more sampling capacitance blocks comprising any of a metal-oxide-semiconductor, metal-insulator-metal and metal-oxide-metal capacitance structures, and a gate capacitance of a transistor.

Claim 15 should read:
15. The apparatus of claim 12, wherein the memory array is partitioned into separate banks of memory subarrays, wherein each bit position of a weight is mapped to a corresponding one of the separate banks of memory subarrays instead of a the memory array column spanning the memory array row, the separate banks of memory subarrays to enable the sampling capacitance network to weight the read operation with the capacitance value C configured according to the mapped bit position of the corresponding one of the separate banks of memory subarrays.

Claim 17 should read:
17. A system comprising:
    a processor;
    a memory device communicatively coupled with the processor, the memory device including a compute-in-memory (CIM) circuit, the CIM circuit comprising a computation circuit coupled to a memory array, the computation circuit comprising:
    a memory access circuit to initiate a read operation on a single memory array row of the memory array, the memory access circuit comprising a read wordline (RWL) coupled to the memory array row and read bitlines (RBLs) coupled to memory cells in memory array columns spanning the memory array row, the read operation including:
    the RBLs precharged with a memory supply voltage, and the RWL to activate the memory cells to drive precharged RBLs to their respective final read voltages, including any one of a 0V or the memory supply voltage;
a sampling capacitance network connected to the memory access circuit, the sampling capacitance network to weight the read operation according to mapped bit positions of a weight stored in the single memory array row, the mapped bit positions corresponding to memory array columns spanning the single memory array row, the sampling capacitance network comprising one or more sampling capacitance blocks to connect a capacitor of capacitance value C to each RBL and a sampling event switch to cause a sampling signal to precharge the sampling capacitance network with the memory supply voltage and add the capacitance value C to each RBL in parallel; and
wherein:
the capacitance value C is configured according to the mapped bit positions of the weight stored in the single memory array row, and
the final read voltages on the RBLs, each weighted based on the capacitance value C, represent the weight stored in the single memory array row.